United States Patent [19]

Zdebel et al.

[11] Patent Number: 5,004,703

[45] Date of Patent: Apr. 2, 1991

[54] MULTIPLE TRENCH SEMICONDUCTOR STRUCTURE METHOD

[75] Inventors: Peter J. Zdebel, Mesa; Barbara Vasquez, Chandler, both of Ariz.

[73] Assignee: Motorola, Schaumburg, Ill.

[21] Appl. No.: 382,947

[22] Filed: Jul. 21, 1989

[51] Int. Cl.⁵ .................................................. H01L 21/76
[52] U.S. Cl. .................................................. 437/67; 437/72
[58] Field of Search .................................................. 437/67, 72

[56] References Cited

U.S. PATENT DOCUMENTS 4,209,349  6/1980  Ho et al. ............................. 156/643

FOREIGN PATENT DOCUMENTS

| 58-3242 | 1/1983 | Japan | 437/67 |
| 58-71638 | 4/1983 | Japan | 437/72 |
| 60-38832 | 2/1985 | Japan | 437/67 |
| 60-128633 | 7/1985 | Japan | 437/72 |
| 61-174739 | 8/1986 | Japan | 437/67 |
| 8804106 | 6/1988 | PCT Int'l Appl. | 437/67 |

*Primary Examiner*—Olik Chaudhuri
*Assistant Examiner*—George R. Fourson
*Attorney, Agent, or Firm*—Harry A. Wolin

[57] ABSTRACT

A method of fabricating multiple trench semiconductor structures wherein a preferred embodiment includes forming an epitaxial silicon layer on a silicon substrate and a dielectric layer on the epitaxial silicon layer. An opening is then formed which extends through the dielectric layer and into the epitaxial silicon layer. Sidewall spacers are formed in the opening and an oxide lens is formed in the opening between the sidewall spacers. The sidewall spacers are then removed and trenches are formed in the opening where the sidewall spacers were formerly disposed.

14 Claims, 2 Drawing Sheets

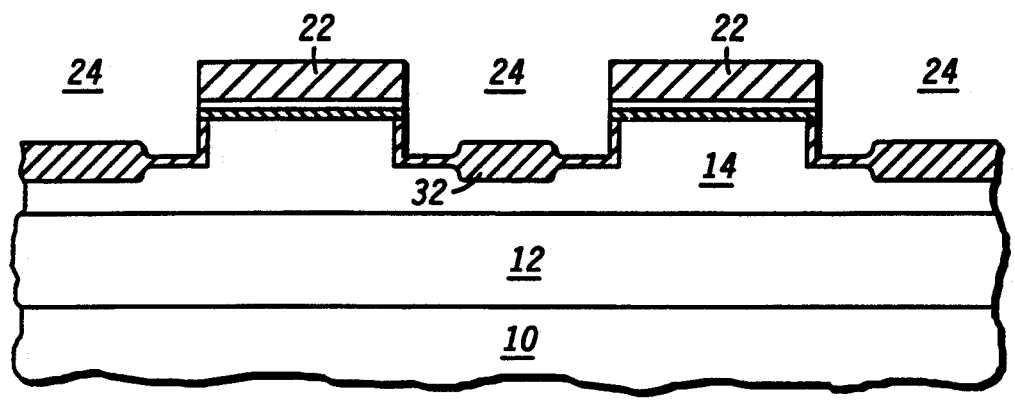
FIG. 4
FIG. 5
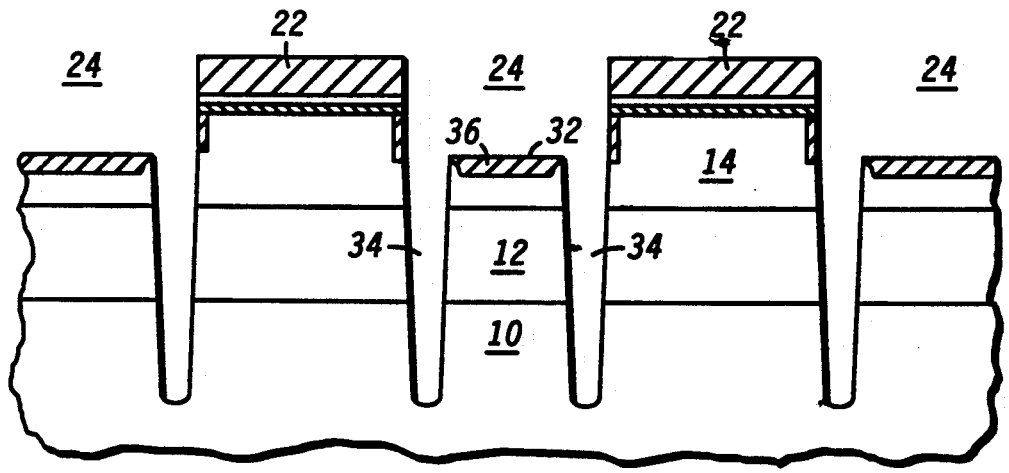

1

MULTIPLE TRENCH SEMICONDUCTOR STRUCTURE METHOD

BACKGROUND OF THE INVENTION

This invention relates, in general, to a method for fabricating semiconductor devices and more particularly to a method of fabricating multiple trench semiconductor structures.

Multiple trench semiconductor structures have commonly included both trench and shallow isolation elements being photolithographically defined. In order to do this, at least two separate mask steps must be employed. Although these photolithographic techniques and methods have been reasonably successful, the scalability of the structure is severely limited partially because of the misregistration budget that must be allowed for.

U.S. Pat. No. 4,209,349, entitled "Method for Forming a Narrow Dimensioned Mask Opening On a Silicon Body Utilizing Reactive Ion Etching" issued to Ho et al. on June 24, 1980, discloses the formation of a narrow mask opening on a silicon body. A second insulator layer is applied on both the horizontal and vertical surfaces of a silicon body and is then reactive ion etched to remove the horizontal layer and provide narrow dimensioned spacers on the silicon body. The surface of the silicon body is then thermally oxidized and the spacers are removed to form a narrow dimensioned mask opening. The narrow dimension mask opening is then employed for implant masking.

SUMMARY OF THE INVENTION

Accordingly, it is an object of the present invention to provide a method for fabricating multiple trench semiconductor structures wherein trench width may be varied for specific applications.

Another object of the present invention is to provide a method for fabricating multiple trench semiconductor structures having submicron trench dimensions.

It is an additional object of the present invention to provide a method for fabricating multiple trench semiconductor structures wherein the trench and shallow element features are non-photolithographically defined.

Yet a further object of the present invention is to provide a method for fabricating multiple trench semiconductor structures wherein the trench and shallow element features depend upon a single masking step.

One more object of the present invention is to provide a method for fabricating multiple trench semiconductor structures where the trenches may be formed on asymmetric wafer surfaces.

The foregoing and other objects and advantages are achieved in the present invention by one embodiment in which, as a part thereof, includes providing a semiconductor substrate and forming a dielectric layer thereon. An opening is then formed in the dielectric layer and sidewall spacers are formed therein. A dielectric lens is formed in the opening between the sidewall spacers which are subsequently removed. Following the removal of the sidewall spacers, trenches are etched in the opening beneath where the sidewall spacers were formerly disposed.

A more complete understanding of the present invention can be attained by considering the following detailed description in conjunction with the accompanying drawings.

BRIEF DESCRIPTION OF THE DRAWINGS

FIGS. 1-5 are highly enlarged cross-sectional views of a multiple trench semiconductor structure during processing.

DETAILED DESCRIPTION OF THE INVENTION

Figure 1:
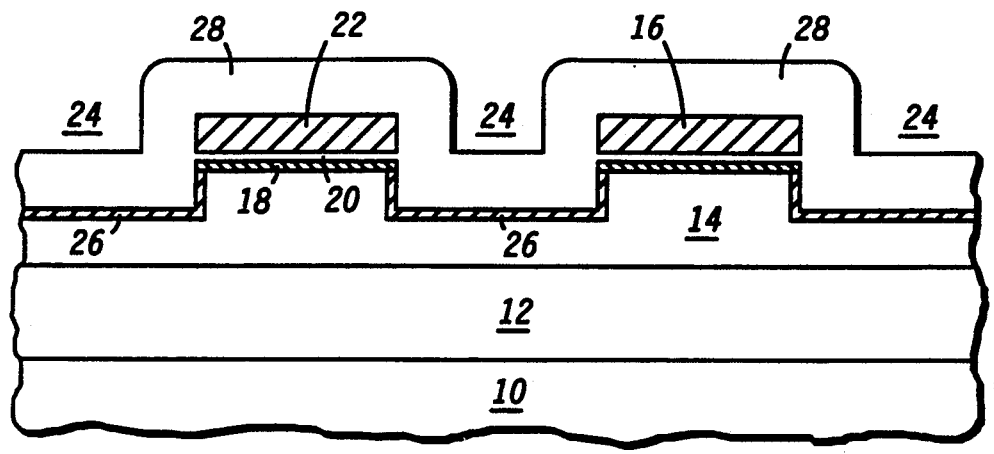

It should be understood that the language "multiple trench" as used herein refers to the semiconductor structure in cross-section. In the preferred embodiment, the multiple trenches depicted in each opening 24 (See FIGS.) are connected and continuous. However, embodiments of the present invention wherein the multiple trenches are truly separate are also possible.

FIGS. 1-5 are highly enlarged cross-sectional views of a multiple trench semiconductor structure during processing. Initially, a semiconductor substrate 10 is provided. In this embodiment, semiconductor substrate 10 is comprised of silicon having an <100> crystallographic orientation and being boron doped. A blanket buried layer 12 is implanted in substrate 10. It should be understood that blanket buried layer 12 is optional depending upon the application for which the structure is used. An epitaxial silicon layer 14 is then formed on silicon substrate 10 by one of many methods well known in the art. Epitaxial silicon layer 14 is also optional depending upon the structure's application.

A dielectric layer 16 is formed on epitaxial silicon layer 14. In this embodiment, dielectric layer 16 includes a thermal oxide layer 18, a nitride layer 20, and an oxide layer 22. Nitride layer 20 is formed by LPCVD while oxide layer 22 is formed by PECVD in this embodiment. It should be understood that layers 18, 20 and 22 comprising dielectric layer 16 form the hardmask for the trench etch and subsequent polysilicon refill planarization if desired. Once dielectric layer 16 has been formed, a single mask isolation photolithography step is employed to define an opening 24. Once the mask has been formed, reactive ion etching is employed to etch through oxide layer 22, nitride layer 20 and thermal oxide layer 18 and stop on epitaxial silicon layer 14. Following this initial etch, the structure is subjected to a resist clean. A second reactive ion etch is subsequently employed to continue etching opening 24 into epitaxial silicon layer 14. It should be structure for trench etch and is optional depending upon the application for which the structure is going to be used.

Once opening 24 has been formed, a thermal oxide layer 26 is formed along the sidewalls and bottom of opening 24. A conformal nitride layer 28 is then formed in opening 24 on thermal oxide layer 26 and also on oxide layer 22 outside of opening 24. It is extremely important that conformal nitride layer 28 contact nitride layer 20 of dielectric layer 16 in opening 24 so that the nitride portion of the structure remains intact and does not separate during future processing steps. Therefore, the edges of nitride layer 20 may need to be exposed following the formation of thermal oxide layer 26. This may be done by techniques well known in the art.

Figure 2:
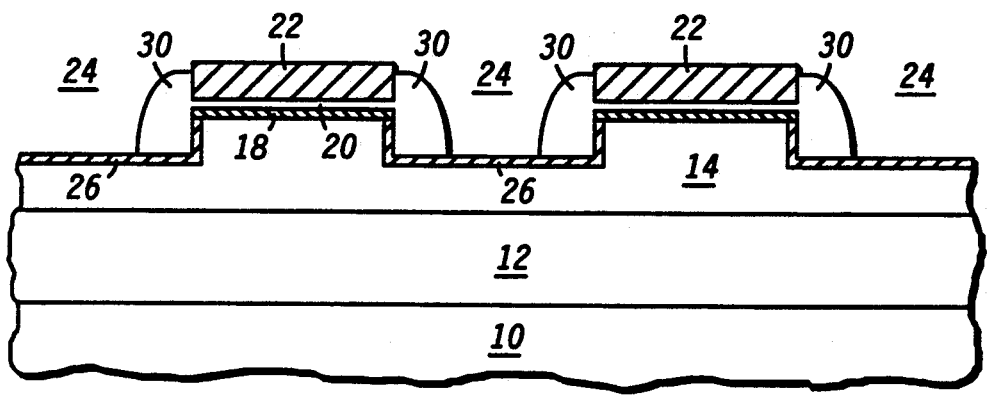

As shown in FIG. 2, conformal nitride layer 28 is etched to form sidewall spacers 30 in opening 24. The etch of conformal nitride layer 28 exposes oxide layer 22 and those portions of thermal oxide layer 26 not covered by sidewall spacers 30. It is important that sidewall spacers 30 extend above the interface between nitride layer 20 and oxide layer 22 to seal the device island between openings 24 during subsequent oxidations.

Figure 3:
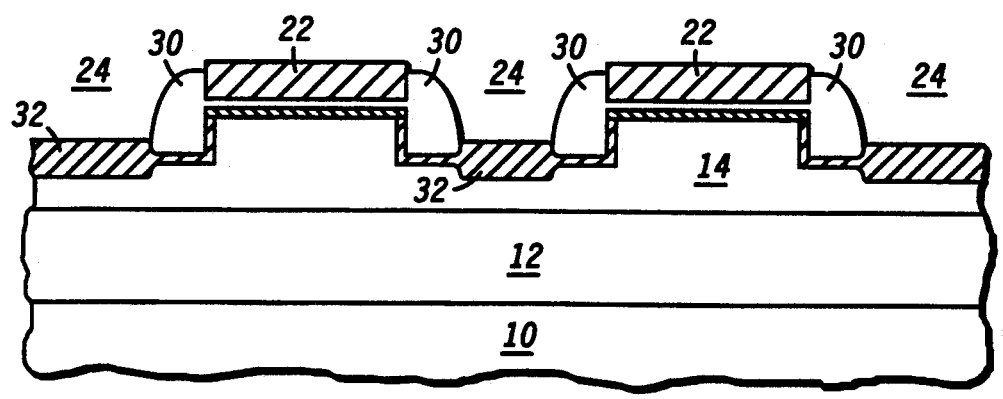

In FIG. 3, an oxide lens 32 is formed in opening 24 between sidewall spacers 30. In this embodiment, oxide lens 32 is formed by thermally oxidizing epitaxial silicon layer 14 between sidewall spacers 30. In can be seen that there is a certain amount of oxide encroachment beneath sidewall spacers 30 that will add to the width of oxide lens 32. The desired thickness of oxide lens 32 is determined by the selectivity of the trench etch (which will be explained presently) to oxide. Another unique feature of this invention is that if oxide lens 32 is formed to be relatively small and spherical, it could be employed for onchip fiber optics.

FIG. 4 depicts the removal of sidewall spacers 30 from opening 24. In this embodiment, a wet etch employing an etchant comprised of hot phosphoric and sulfuric acids is used for the nitride etch although one of skill in the art will understand that other etchants may be employed. The determining factor should be the selectivity of the nitride etch to oxide.

The present invention results in the formation of an asymmetric dielectric hardmask employed to define the etch of trenches 34. The dielectric hardmask is comprised of dielectric layer 16 and oxide lens 32 which, as shown, are non-planar. The optional etch of epitaxial silicon layer 14 results in an even more exaggerated asymmetry than would result if opening 24 extended only to epitaxial silicon layer 14 and not into it.

Trenches 34 are etched in opening 24 at the regions where sidewall spacers 30 were formerly disposed. In this embodiment, trenches 34 are shown to extend through epitaxial silicon layer 14 and into silicon substrate 10 beyond blanket buried layer 12 although it should be understood that trench depth is application specific.

The structure as shown in FIG. 5 may then be employed in a variety of applications. If the structure is to be employed as a portion of an isolation structure, a dielectric trench liner layer must be formed. The dielectric trench liner layer may comprise oxide, nitride, oxynitride or combinations thereof. Once the dielectric trench liner layer has been formed, the trenches may be filled with oxide or polysilicon. A shallow element feature may be formed at region 36 by etching back oxide fill or oxidizing polysilicon fill. If the polysilicon fill is to be oxidized, it should be understood that the optional recess of epitaxial silicon layer 14 in the formation of opening 24 will allow for a planar isolation structure.

If a cylindrical capacitor application using the structure depicted by FIG. 5 is desired, a dielectric trench liner layer as disclosed above must also be employed to form the capacitor dielectric. The trenches are then filled with polysilicon to complete the capacitor structure.

Thus it is apparent that there has been provided, in accordance with the invention, a method of fabricating multiple trench semiconductor structures which meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A method of forming a multiple trench semiconductor structure comprising the steps of:
   providing a semiconductor substrate;
   forming a blanket buried layer in said semiconductor substrate;
   forming a dielectric layer on said semiconductor substrate;
   forming at least one opening in said dielectric layer; and in the following order:
   forming an oxide layer on the bottom and sidewalls of said at least one opening;
   forming sidewall spacers in said at least one opening;
   forming a dielectric lens in said at least one opening between said sidewall spacers;
   removing said sidewall spacers; and
   forming trenches in said at least one opening where said sidewall spacers were formerly disposed.

2. The method of claim 1 wherein a semiconductor layer is formed on said semiconductor substrate prior to the formation of the dielectric layer.

3. The method of claim 2 wherein the dielectric layer comprises an oxide layer formed on the semiconductor layer, a nitride layer formed on the oxide layer and a second oxide layer formed on the nitride layer.

4. The method of claim 3 wherein a conformal nitride layer is formed over the structure following the formation of the oxide layer in said at least one opening, the sidewall spacers being formed by etching said conformal nitride layer.

5. The method of claim 4 wherein the dielectric lens is formed by thermally oxidizing the semiconductor material disposed between the sidewall spacers in the at least one opening.

6. A method of forming a multiple trench semiconductor structure comprising the steps of:
   providing a silicon substrate;
   forming a blanket buried layer in said silicon substrate;
   forming an epitaxial silicon layer on said substrate;
   forming a dielectric layer on said epitaxial silicon layer;
   forming at least one opening in said dielectric layer, said at least one opening extending into said epitaxial silicon layer; and in the following order:
   forming an oxide layer on the bottom and sidewalls of said at least one opening;
   forming sidewall spacers in said at least one opening;
   thermally oxidizing said epitaxial silicon layer disposed between said sidewall spacers in said at least one opening to form an oxide lens;
   removing said sidewall spacers; and
   forming trenches in said at least one opening where said sidewall spacers were formerly disposed.

7. The method of claim 6 wherein the dielectric layer comprises an oxide layer formed on the epitaxial silicon layer, a nitride layer formed on the oxide layer and a second oxide layer formed on the nitride layer.

8. The method of claim 6 wherein a conformal nitride layer is formed over the structure following the formation of the oxide layer in said at least one opening, the sidewall spacers being formed by etching said conformal nitride layer.

9. The method of claim 6 wherein a trench liner layer is formed in the trenches, said trench liner layer comprising an oxide layer disposed in said trench and a nitride layer disposed on said oxide layer.

10. The method of claim 9 wherein the trenches are filled by forming polysilicon therein.

11. A method of forming a multiple trench semiconductor structure comprising the steps of:
   providing a silicon substrate;
   implanting a blanket buried layer in said substrate;
   forming an epitaxial silicon layer on said substrate;
   forming a thermal oxide layer on said epitaxial silicon layer;
   forming a nitride layer on said thermal oxide layer;
   forming an oxide layer on said nitride layer;
   forming a mask on said oxide layer to define at least one opening;
   etching at least one opening through said thermal oxide, nitride and oxide layers into said epitaxial silicon layer; and in the following order:
   forming a thermal oxide layer in said at least one opening;
   forming a conformal nitride layer on the semiconductor structure;
   etching said conformal nitride layer to form sidewall spacers in said at least one opening;
   thermally oxidizing the epitaxial silicon layer disposed between said sidewall spacers in said at least one opening to form an oxide lens;
   removing said sidewall spacers; and
   forming trenches in said at least one opening where said sidewall spacers were formerly disposed.

12. The method of claim 11 wherein a trench liner layer is formed in the trenches, said trench liner layer comprising an oxide layer disposed in said trench and a nitride layer disposed on said oxide layer.

13. The method of claim 12 wherein the trenches are filled by forming polysilicon therein.

14. The method of claim 12 wherein the trenches are filled by forming oxide therein.

* * * * *